United States Patent [19]

Munning Schmidt et al.

[11] Patent Number: 4,835,453
[45] Date of Patent: May 30, 1989

[54] BATTERY-POWERED DEVICE

[75] Inventors: Robert H. Munning Schmidt; Geert J. Bosscha, both of Drachten, Netherlands

[73] Assignee: U.S. Philips Corp., New York, N.Y.

[21] Appl. No.: 121,445

[22] Filed: Nov. 16, 1987

[30] Foreign Application Priority Data

Jul. 7, 1987 [NL] Netherlands ............... 8701597

[51] Int. Cl.$^4$ ............... G08B 21/00; H02J 7/00
[52] U.S. Cl. ............... 320/13; 320/37; 320/48
[58] Field of Search ............... 320/20, 37, 38, 48, 320/43, 44

[56] References Cited

U.S. PATENT DOCUMENTS

| 4,286,204 | 8/1981 | Belot | 320/37 X |
| 4,380,726 | 4/1983 | Sado et al. | 320/37 X |
| 4,638,237 | 1/1987 | Fernandez | 320/43 X |
| 4,743,831 | 5/1988 | Young | 320/48 X |

Primary Examiner—R. J. Hickey
Attorney, Agent, or Firm—Bernard Franzblau

[57] ABSTRACT

In a device where a load ($R_L$) is powered by a battery (6) if a first detection device (100) detects that the expired discharge time measured by measurement means (40, 70) is equal to a first reference value stored in a memory (22), a first time measurement apparatus (40, 80) measures the time during which the load is powered by the battery. When the load is switched off and is not connected to the AC supply voltage via a power-supply circuit (1), the battery is discharged by a discharger (9). Second time-measurement apparatus (50, 80) measure the time during which the discharger is operative until a second detection device (13) detects a battery voltage at which the battery may be regarded as fully discharged. After comparison of the sum of the time intervals measured by the first and the second time-measurement apparatus with a second reference value stored in a memory (21), a correction device corrects the reference value stored in a memory (22) in such the way that during a next discharge the sum of the time intervals measured by the first and the second time-measurement apparatus is in better agreement with the second reference value.

11 Claims, 5 Drawing Sheets

BATTERY-POWERED DEVICE

BACKGROUND OF THE INVENTION

This invention relates to a device comprising:
a load which can be powered by a battery, and
a power-supply circuit for charging the battery and/or powering the load.

In the present application "battery" is to be understood to mean a unit comprising one or more cells, such as nickel-cadmium cells.

Such a device is constituted by, for example, a domestic appliance which can be battery-powered or which can be mains-powered by means of a power-supply circuit. The battery can be recharged by the power-supply circuit when the appliance is switched off. In particular, such a device may be constituted by a rechargeable electric shaver.

Such a device is known from European Patent Application No. 110,466, which corresponds to U.S. Pat. No. 4,536,757 (8/20/85). In said known device a voltage is detected to generate a signal which informs the user that the battery is almost drained and must be recharged before long. This voltage is selected in such a way that below this voltage at least one period of use of, for example, approximately 5 minutes is available. Instead of a voltage it is also possible, as in a device in accordance with the present application, to generate a nearly-discharged signal after detection that a certain discharge time has expired. However, it is found that many users recharge the battery immediately after the occurrence of such a nearly-discharged signal. As a result of this, the batteries are never discharged completely. However, in the course of time the unused battery material becomes inert causing the battery capacity to decrease. As a result of this, the time still available for use, after the nearly-discharged indication, decreases, so that ultimately a full period of use is not available any more. Moreover, the battery capacity also decreases as a result of aging, so that the time still available for use after the nearly-discharged indication also decreases. In addition, in the known device the time still available for use depends on the extent to which the battery is loaded by the device. A related battery powered device is described in copending U.S. application Ser. No. 121,446 filed Nov. 16, 1987.

SUMMARY OF THE INVENTION

Therefore, it is an object of the invention to provide a device in which the time still available for use after the nearly-discharged indication remains substantially constant. In accordance with the invention a device of the type defined in the opening paragraph is characterized in that the device further comprises
first detection means for detecting expiration of a discharge time of the battery,
second detection means for detecting a battery voltage substantially equal to a threshold value,
a discharger for discharging the battery, with the load switched off, after detection of expiration of the discharge time until detection of the threshold value,
first time-measurement means for measuring the time during which the load is powered by the battery after detection of expiration of said discharge time until the threshold value is reached,
second time-measurement means for measuring the time during which the discharger has been operative, and
correction means for correcting the expired discharge time depending on the magnitude of the weighted sum of the time intervals measured by the first and the second time-measurement means relative to a reference value.

Upon detection of expiration of the selected discharge time in a device in accordance with the invention after the load has been switched off, a discharger circuit discharges the battery to a voltage at which the battery may be regarded as fully discharged. The time is measured during which the load is powered by the battery after expiration of the selected discharge time and the time during which the discharger circuit is operative. The weighted sum of these time intervals is compared with a reference value which corresponds to the desired time of use still available after detection of expiration of the discharge time. Depending on the result, the discharge time setting is extended or reduced in such way that during a subsequent discharge the time of use still available after detection of expiration of said discharge time substantially corresponds to the desired value. This ensures that after the nearly-discharged indication, always at least one period of use of, for example, 5 minutes is available to the user.

It is to be noted that U.S. Pat. No. 4,575,669 describes a device for completely discharging the battery in order to keep the battery capacity as large as possible. However, in this device no adaptation of the expired discharge time is effected.

An embodiment of a device in accordance with the invention may be characterized in that the device further comprises
third detection means for detecting a weighted sum of the time intervals measured by the first and the second time-measurement means, which sum is substantially equal to the reference value, and for switching off the discharger or the load after detection of said sum.

In this embodiment the discharger is switched off if the battery voltage decreases below the value $V_1$ or if prior to this the weighted sum of the time intervals measured by the first and the second time measurement means becomes equal to the reference value. In the first case the residual shaving time available after detection of expiration of the discharge time is smaller than the reference value and the discharge time is reduced and in the second case the residual discharge time is larger than the reference value and the discharge time is increased. In this way it is achieved that the discharger circuit is operative as briefly as possible, which is of special importance for power-supply circuits with a quick-charging facility.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
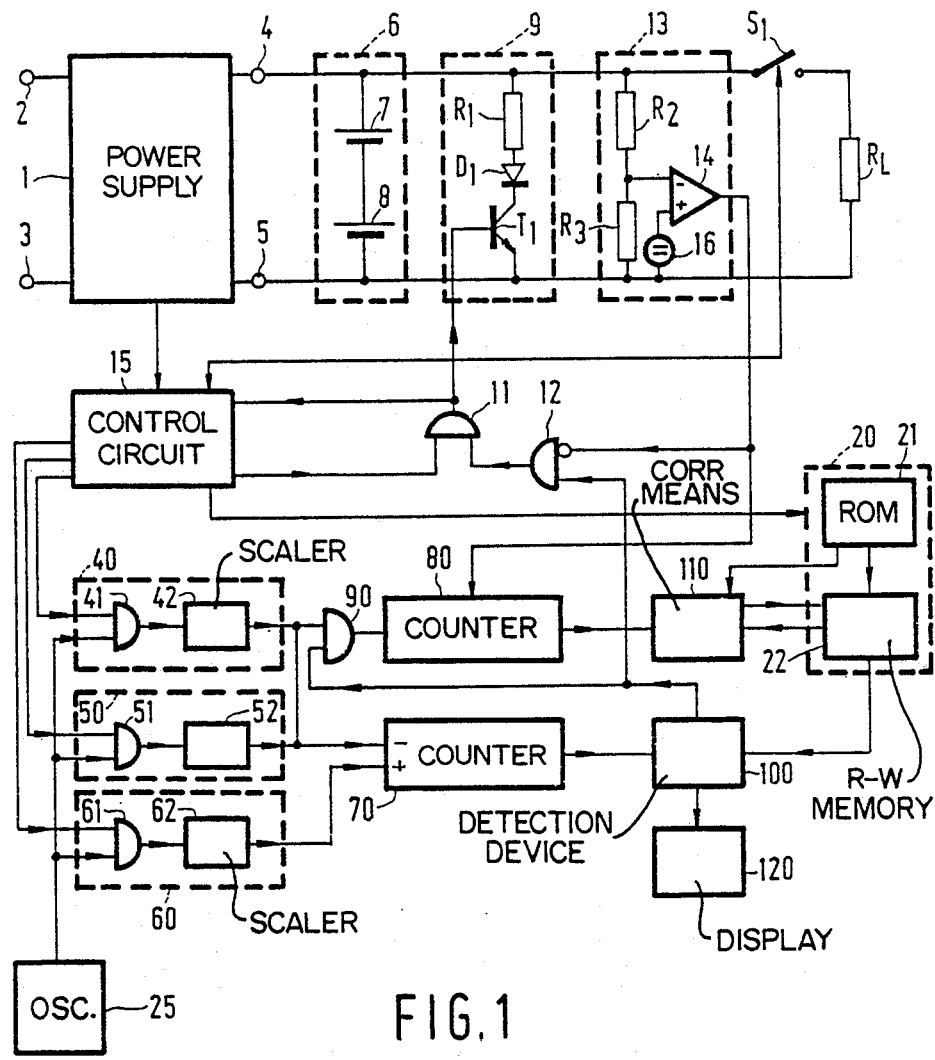
FIG. 1 shows a first embodiment of a device in accordance with the invention.

FIG. 1 shows a first embodiment of a device in accordance with the invention. The device comprises a power-supply circuit 1 with input terminals 2 and 3 for applying to the device a mains voltage which may be either an alternating voltage or a direct voltage. The power-supply circuit is, for example, a switched-mode power supply as disclosed in British Patent Specification No. 2,000,394 or European Patent Application No. 30,026. The outputs 4 and 5 of the power-supply circuit 1 are connected to a battery 6, which in the present example comprises two series-connected nickel-cadmium cells 7 and 8. A load $R_L$, for example the motor of a dry-shaver, can be connected in parallel with the battery 6 by means of a switch $S_1$.

When connected to the mains voltage and with the switch $S_1$ in the open position, the power-supply circuit 1 supplies the charging current for the battery, which mode is referred to hereinafter as the battery-charging mode. When connected to the mains voltage and with the switch $S_1$ closed, the power-supply circuit 1 supplies a current to the load $R_L$ and a small charging current to the battery 6 if the battery voltage is lower than the value at which the voltage across the load $R_L$ is stabilized by the power-supply circuit 1. This situation will be referred to hereinafter as the mains-shaving mode. If the power-supply circuit is not connected to the mains voltage and the switch $S_1$ is closed, the current to the load $R_L$ is supplied by the battery. Hereinafter, this mode will be referred to as the battery-shaving mode. It is to be noted that instead of one circuit the power-supply circuit may comprise two circuits, one circuit powering the motor in the mains-shaving mode and the other circuit charging the batteries in the battery-charging mode.

The device comprises a control circuit 15 which, by means of a signal which provides information as to whether or not the power-supply circuit 1 is connected to the mains voltage, and by a signal which provides information as to whether the switch $S_1$ is closed or open, detects whether the battery-shaving, mains-shaving or battery-charging mode occurs and depending on this controls the other circuitry of the device.

The device further comprises a discharger 9 for discharging the battery, which discharger comprises a transistor $T_1$ whose collector-emitter path is arranged in series with a resistor $R_1$ for sensing the magnitude of the discharging current and a light-emitting diode $D_1$ which indicates whether the discharger is operative. It is to be noted that as an alternative the resistor $R_1$ may be arranged in the emitter line of the transistor $T_1$. Further, the diode $D_1$ may be arranged at other locations in the circuit to indicate whether the discharger 9 is operative. The base of the transistor $T_1$ is driven by the output of an AND-gate 11, which receives a signal from the control device 15. This signal is comparatively low in the battery-shaving mode and is comparatively high in all of the other modes. The AND-gate 11 also receives output signal from an AND-gate 12. The output signal of the AND-gate 11 is also applied to the control device 15 to indicate that the discharger 9 is operative.

The device also comprises detection means 13 for detecting a battery voltage $V_1$ which is substantially equal to the voltage at which the battery 6 may be regarded as fully discharged. The detection means 13 comprises, for example, a voltage divider which is arranged across the battery 6 and which comprises resistors $R_2$ and $R_3$ whose junction point is connected to the inverting input of a comparator 14, whose non-inverting input is connected to a voltage source 16 supplying a direct voltage $V_1$. The output of the comparator 14 constitutes the output of the detection means 13 and supplies a signal which is comparatively low as long as the fraction of the battery voltage defined by the resistors $R_2$ and $R_3$ is higher than the voltage $V_1$ and which is relatively high in the opposite case.

The device further comprises means 60, 70 for charging the battery 6 for a fixed time interval. These means comprise an AND-gate 61 and a scaler 62. One input of the gate 61 is connected to an oscillator 25, the other input being connected to an output of the control device 15. In the battery-charging mode this output carries a relatively high signal and in the other modes it carries a relatively low signal. The output of the scaler 62 is connected to the count-up input (+) of a counter 70. This counter has an output 71 on which, when a specific maximum count is reached, a signal appears by means of which the power-supply circuit 1 is switched-off. For a given frequency of the pulses from the scaler 62, this maximum count is selected in such a way that the power-supply circuit 1 is switched off after a time interval in which it has almost fully charged a battery to its nominal capacity.

The device further comprises means 40, 70 for measuring the discharge time of the battery 6 in the battery-shaving mode. These means comprise an AND-gate 41 and a scaler 42. One input of the gate 41 is connected to the oscillator 25 and the other input is connected to an output of the control device 15. This output carries a relatively high signal in the battery-shaving mode and a relatively low signal in the other modes. The output of the scaler 42 is connected to the count-down input (−) of the counter 70. The frequency of the pulses out of the scaler 42 is such that the counter 70 reaches its minimum count after a time interval in which a battery 6 having its nominal capacity is almost completely discharged at the nominal shaving current. This nominal discharge time is, for example, 45 minutes.

The device further comprises means 20 comprising a read-only memory 21 which stores a reference value which indicates the desired shaving time still available after a specific discharge time has expired. This reference value is selected, for example, in such a way that the residual shaving time is 10 minutes. Said means 20 further comprise a read-write memory 22 into which the value from the read-only memory 21 is loaded when the device is put into use for the first time and after every replacement of the battery 6. After every discharge the value stored in the memory 22 is corrected by correction means 110. The device comprises a detection device 100 in which the count of the counter 70 is compared with the value from the memory 22. When equality of these values is detected the signal on the output of the detection device 100 becomes relatively high. This output is connected to a display device 120, which informs the user that the battery 6 is nearly discharged and must be recharged before long. The output of the detection device is further connected to an input of the AND-gate 12 and to an input of an AND-gate 90 whose other input is connected to the output of the scaler 42. The output of the gate 90 is connected to the input of a counter 80. The means 40 and the counter 80 constitute the first time-measurement means for measuring the time during which the load $R_L$ is powered by the battery 6 after detection of expiration of the discharge time by the detection device 100.

The device further comprises second time-measurement means 50, 80 for measuring the time interval during which the discharger 9 is operative. The means 50 comprise an AND-gate 51 and a scaler 52. One input of the gate 51 is connected to the oscillator 25 and the other input is connected to an output of the control device 15, which output carries a relatively high signal if the discharger is operative. The output of the scaler 52 is connected to an input of the gate 90 and to the count-down input of the counter 70. The ratio between the frequencies of the scalers 42 and 52 is equal to the ratio between the discharge current of the discharger 9 and the nominal shaving current in the battery-charging mode. As a result of this, the count of the counter 80 is always equal to the weighted sum of the time intervals measured by the first and the second time-measurement means.

Finally, the device comprises correction means 110 which, after detection of a battery voltage below the value $V_1$ by the device 13, compares the count 80 of the counter with the reference value from the read-only memory 21 and, depending on the result, corrects the value in the read-write memory 22.

The operation of the device may be explained as follows. It is assumed that the battery 6 is in the fully charged condition. The counter 70 then has its maximum count. This count represents a discharge time of, for example, 45 minutes. This time corresponds to the discharge time for a battery 6 having its nominal capacity at a nominal discharge current. The read-only memory 21 stores a reference value which indicates the desired residual shaving time of, for example, 10 minutes available after detection that a specific discharge time has elapsed. This reference value corresponds to the count of the counter 70 after a discharge time of, in the present case, 35 minutes has expired. It is further assumed that the battery 6 is discharged for the first time. The value from the read-only memory 21 is then loaded into the read-write memory 22. In the battery-shaving mode, in which the switch $S_1$ is closed and the power-supply circuit 1 is not connected to the mains voltage, pulses from the clock 25 are applied to the counter 70 via the AND-gate 41 and the scaler 42, so that the count of said counter is reduced. In this situation the output of the comparator 14 and the output of the detection device 100 are low, so that the output of gate 12 is low. Consequently, the output of gate 11 is low so that the discharger is inoperative. After the detection device 100 has detected expiration of a discharge time of, in the present example, 35 minutes, the pulses from the scaler 42 are also applied to the counter 80 via the AND-gate 90, which is now open. Moreover, the display 120 is driven as an indication to the user that only a limited shaving time is available and the battery 6 must be recharged shortly. Moreover, the output of the AND-gate 12 then goes high. Since the signal from the control circuit 15 which is applied to the AND-gate 11 in the battery-shaving mode is low, the output of the AND-gate 11 is low so that the discharger 9 is disabled. If the battery-shaving mode is terminated by opening the switch $S_1$ the AND-gate 41 is closed by a signal from the control device 15. The count of the counter 80 then indicates the time during which the load $R_L$ has still been powered by the battery 6 after detection of expiration of a discharge time of 35 minutes. The output of the AND-gate 11 then goes high so that the discharger 9 is rendered operative and the battery 6 is discharged. At the same time a signal from the control circuit 15 opens the AND-gate 51, causing pulses from the oscillator 25 to be applied to the counter 80 via the scaler 52. If the battery voltage decreases to the value $V_1$ the voltage on the output of the detection device 13 becomes relatively high, causing the AND-gates 12 and 11 to be closed and hence the discharger 9 to be switched off. Moreover, the AND-gate 51 is closed so that the supply of pulses to the counter 80 ceases. If the actual capacity of the battery 6 is equal to its nominal capacity and the actual shaving current is equal to the nominal shaving current, the count of the counter 80 will be representative of the residual shaving time of 10 minutes still available after detection of the expiration of the 35-minutes shaving time by the detection device 100. Since the output signal of the detection device 13 has gone high, said count is applied to correction means 110 in which it is compared with the reference value from the memory 21. In the case described here these values are equal and the value in the memory 22 is not corrected. However, if the capacity of the battery 6 is, for example, smaller or has become smaller than the nominal battery capacity as a result of aging, or if the shaving current has been larger than the nominal shaving current, the count of the counter 80 will indicate a residual shaving time shorter than the reference value of 10 minutes after detection of the expiration of the 35 minutes shaving time. In that case the value in the read-write memory 22 is increased by the correction means 110. This increase may be incremental but it may also be an increase which is proportional to the difference between the count of the counter 80 and the reference value from the memory 21. As a result of this correction the detection device 100 will detect the expiration of a discharge time shorter than 35 minutes during a subsequent discharge. Therefore, the shaving time still available after this detection until detection of the fully discharged condition of the battery 6 increases, so that this time is in closer agreement with the desired residual shaving time of, in the present case, 10 minutes. If the capacity of the battery 6 is larger than the nominal battery capacity or if the shaving current is smaller than the nominal shaving current, the count of the counter 80 will indicate a residual shaving time which is longer than the 10 minutes reference value. In that case the correction means 110 reduce the value in the read-write memory 22. As a result, the detection device 100 will detect the expiration of a discharge time longer than 35 minutes during the next discharge, so that the residual shaving time after detection decreases and is in closer agreement with the desired residual shaving time. In this way it is achieved that after every discharge the expired discharge time detected by said detection means 100 is adapted in such a way that the residual discharge time after this detection is always the closest possible approximation to the desired residual discharge time. Moreover, since the battery is fully discharged after detection, the battery capacity remains as large as possible.

If the discharger circuit 9 is operative and the user connects the power-supply circuit 1 to the mains voltage to recharge the battery 6, the power-supply circuit will have to be rendered inoperative depending on the magnitude of the charging current supplied by the power-supply circuit. If the power-supply circuit 1 is of a type which in a comparatively long time, for example 8 hours, fully charges the battery 6 with a current which is small relative to the discharge current, the power-supply circuit will not significantly influence the operation of the further circuitry and need not be rendered inoperative. If the power-supply circuit is of a type which in a comparatively short time, for example half an hour, charges the battery 6 with a comparatively large current, the power-supply circuit 1 must be rendered inoperative. This can be realized simply by means of a control signal from the control device 15.

Figure 2:
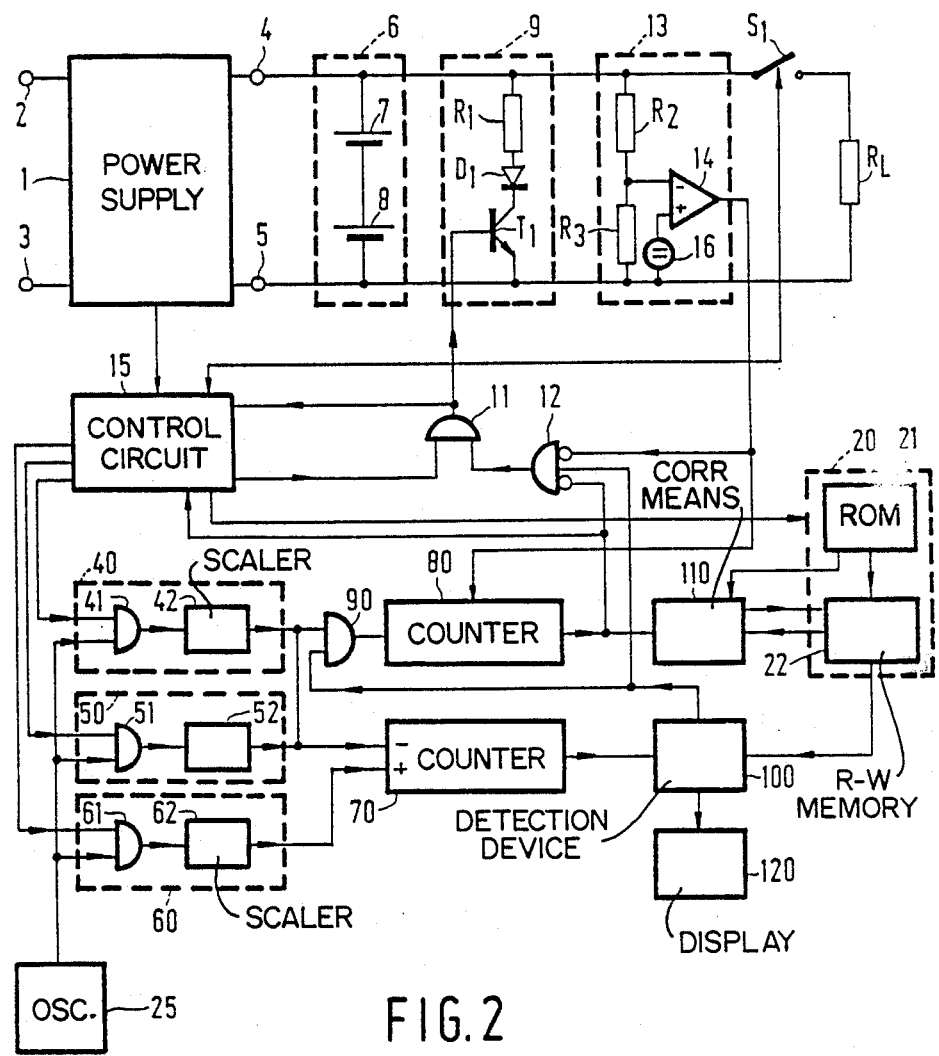
FIG. 2 shows a second embodiment of a device in accordance with the invention.

FIG. 2 shows a second embodiment of a device in accordance with the invention, in which identical parts bear the same reference numerals as in FIG. 1. In the present embodiment the counter 80 is a counter having a maximum count corresponding to the desired residual shaving time after detection of the expiration of the discharge time by the detection device 100. In the numerical example of FIG. 1 this count corresponds to a residual shaving time of 10 minutes. The output of the counter 80 is connected not only to the correction means 110 but also to a second inverting input of the AND-gate 12 and to the control device 15. If the battery voltage has decreased to a value $V_1$ before the counter 80 has reached its maximum count, the detection device 13 switches off the discharging circuit 9 or opens the switch $S_1$ and the correction means 110 decrement the value stored in the read-write memory 22. If the count has reached its maximum value before the battery voltage has decreased to the value $V_1$, the output signal of the counter 80 switches off the discharging circuit 9 or opens the switch $S_1$ and the correction means 110 increment the value stored in the memory 22. In this way it is again achieved that the expired discharge time detected by the detection device 100 is each time adapted in such a way that the residual discharge time apparatus as closely as possible the desired value.

The device shown in FIG. 2 is particularly suitable for apparatuses provided with a power-supply circuit with a quick-charging facility. If the power-supply circuit is connected to the mains voltage and the expired discharge time is longer than the time detected by the detection device 100, the battery 6 in such apparatus is charged with a comparatively large current within a comparatively short time, for example 6 minutes, so that within a short time a shaving time of, for example, 10 minutes is available again. However, when the apparatus is switched off the discharge circuit 9 is switched on, so that the power-supply circuit 1 is rendered inoperative. If discharging of the battery 6 by the discharger circuit 9 takes, for example, 4 minutes, the shaving time available 6 minutes after connection to the mains voltage is substantially shorter than the expected shaving time. Since the discharger circuit 9 in the device of FIG. 2 is operative for, for example, 2 minutes at the most, the shaving time available after 6 minutes is much longer and is generally adequate for one or two shaves.

Figure 3:
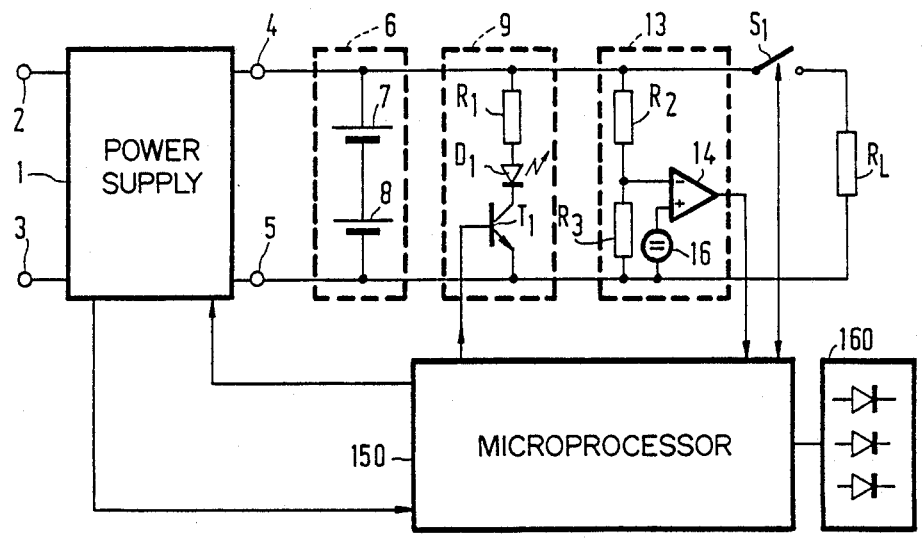
FIG. 3 shows a third embodiment of a device in accordance with the invention.

The functions of the first and the second detection means, the first and the second time-measurement means and the correction means described with reference to FIGS. 1 and 2 can be realized advantageously by means of a micro-processor. FIG. 3 shows the block diagram of such a device. The device again comprises a power-supply circuit 1, a battery 6, a discharger 9 and a detection device 13. The device further comprises a microprocessor 150 and a plurality of display elements, schematically shown in block 160, to indicate the various modes. The microprocessor 150 receives a signal which indicates whether the power-supply circuit 1 is connected to the mains voltage, a signal which indicates whether the switch $S_1$ is closed, and the output signal of the detection device 13. On the basis of this information the microprocessor controls the discharger circuit 9, the power-supply circuit 1, the switch $S_1$ and the display block 160.

Figure 4A:
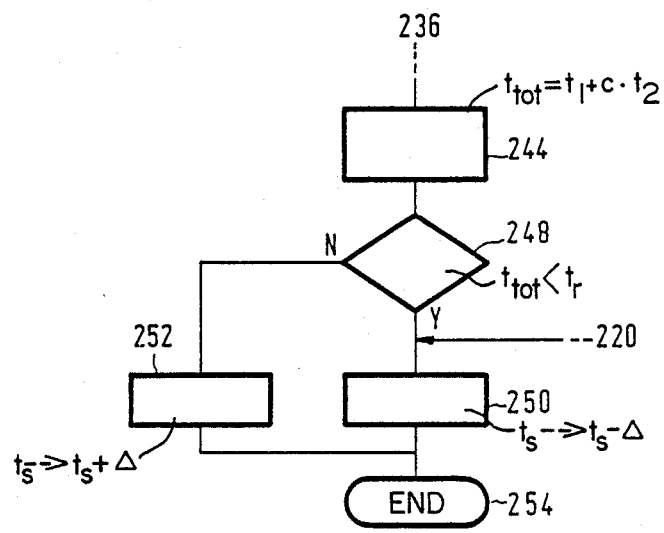
FIGS. 4a and 4b are flow charts of the program of the microprocessor shown in FIG. 3 in the case where the device of FIG. 3 operates in the same way as that shown in FIG. 1.
Figure 4B:
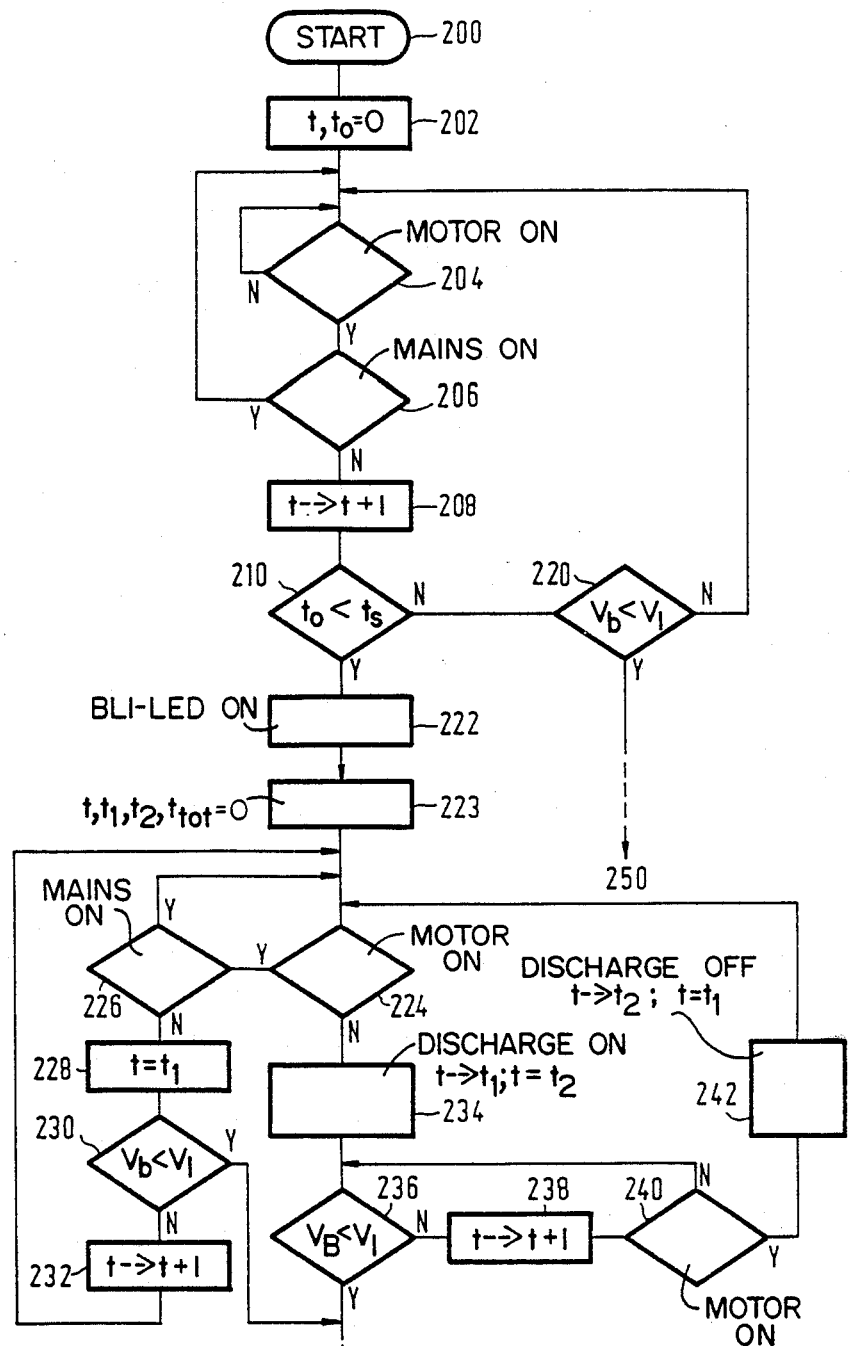

FIGS. 4A and 4B are flow charts of the program performed by the microprocessor 150 in the case where the operation of the device corresponds to that of FIG. 1. The program may be described as follows: In block 202, designated "$t,t_0=0$" the time t and the discharge time $t_0$ stored in the memory are reset to zero. In block 204, designated "motor on", it is first ascertained whether the switch $S_1$ is closed and the motor is on. Subsequently, in block 206, designated "mains on" it is ascertained whether the power-supply circuit 1 is connected to the mains voltage. If this is the case the mains-shaving mode occurs and the program returns to block 204. As long as the mains-shaving mode occurs this loop is followed. If the power-supply circuit is not connected to the mains voltage, the battery-shaving mode occurs and in block 208, designated "$t \rightarrow t+1$" the time is increased. Subsequently, in block 210, designated "$t_0 < t_s$" it is ascertained whether the expired discharge time $t_0$ exceeds the time setting $t_s$ and if this is not the case it is ascertained in block 220, designated "$V_b < V_1$" whether the battery voltage $V_b$ has become smaller than the threshold value $V_1$. If this is not the case, the program returns to block 204 and this loop is repeated. If the discharge time $t_s$ has not yet expired but the battery voltage $V_b$ has decreased to the value $V_1$, the discharge time setting is much too long. In block 250, designated "$t_s \rightarrow t_s - \Delta$" the discharge time setting $t_s$ is then reduced. If in block 210 it is detected that the discharge time $t_s$ has expired a LED or other indicator in block 160 of FIG. 3 is driven in block 222, designated "BLI-LED on", to indicate to the user that the battery 6 is nearly discharged and must be recharged shortly. Subsequently, in block 223, designated "$t,t_1,t_s=0$" the time t, the value of the shaving time $t_1$ stored in the memory and the discharge time $t_2$ are reset to zero. After this, in block 224, designated "motor on", it is detected whether is motor is on, after which in block 226, designated "mains on", it is detected whether the power-supply circuit 1 is connected to the mains voltage. In the battery-shaving mode, in block 228, designated "$t=t_1$", the time is set to the value $t_1$ stored in the memory, which in the present example is equal to zero. Subsequently, in block 230, designated "$V_b < V_1$" it is ascertained whether the battery voltage has decreased to a value below the threshold voltage $V_1$. If this is the case, the program jumps to block 244, designated "$t_{tot} = t_1 + C.t_2$". If it is not the case, each time after the loop has been completed the count is incremented by one in block 232, designated "$t \rightarrow t+1$", so that the time $t_1$ is measured during which the motor is powered by the battery after detection that the discharge time $t_s$ has expired. In block 234, designated "discharge on, $t \rightarrow t_1; t=t_2$", if the motor is switched off in the battery shaving mode, the discharger circuit 9 is switched on, and the power-supply circuit is switched off if necessary, while a display element in block 160 may switched on to indicate, shortly after switching off, that the battery 6 must be recharged, and a LED of block 160 in FIG. 3 may be switched on to indicate that the discharger circuit 9 is operative. The time $t_1$ during which the motor has been switched on in the battery-shaving mode after the expiration of the discharge time $t_s$ is loaded into the memory and the time t is set to the value $t_2$, which in the present example is equal to zero because the discharger circuit 9 has not yet been operative previously. In block 236, designated "$V_b < V_1$", it is subsequently ascertained whether the battery voltage has decreased below the value $V_1$. If this is not the case, in block 238, designated "t→t+1", the time is increased and, subsequently, in block 240, designated "motor on", it is detected whether the motor is not switched on. As long as the motor is not switched on again, the time $t_2$ during which the discharger circuit 9 is operative is measured. If the motor is switched on again because the user wishes to continue shaving, in block 242, designated "discharge-off, t→$t_2$, t=$t_1$" the discharger circuit and the discharge LED are turned off, the power-supply circuit is switched on again if it is off, the time $t_2$ during which the discharging circuit has been operative is loaded into the memory, and the time is set to the value $t_1$ stored in the memory. Subsequently, the program jumps back to block 224 and the loop is executed again to measure the time during which the motor is operative, which time is added to the time $t_1$ during which the motor has already been operative. If after this the motor is switched off again, the discharger circuit 9 is switched on again and the time is measured during which it is switched on and is added to the time $t_2$ in which the discharger circuit 9 has already been switched on. If it is detected in block 236 that the battery voltage has decreased below the value $V_1$, then in block 244, designated "$t_{tot} = t_1 + c.t_2$", the discharger circuit is switched off and the weighted sum is determined of the time $t_1$ during which the battery has been discharged by the motor after detection of the expiration of the time $t_s$ and the time $t_2$ during which the discharger circuit 9 has been operative, the weighting factor C being equal to the ratio between the discharging current and the nominal shaving current. Consequently, the time $t_{tot}$ indicates the total nominal shaving time still available until the voltage $V_1$ is reached after detection of the time $t_1$. Subsequently, in block 248, designated "$t_{tot} < t_r$" it is ascertained whether this total time $t_{tot}$ is smaller than the reference value $t_r$. If this is the case, in block 250, designated "$t_s → t_s - \Delta$" the time $t_s$ is decreased incrementally of proportionally so that, during the next discharge after detection of the expiration of the discharge time, a longer shaving time is available until the battery voltage $V_1$ is reached. If the time $t_{tot}$ is longer, said time $t_s$ is increased in block 252, designated "$t_s → t_s + \Delta$", so that during the next discharge after detection of the expiration of this time $t_s$ the shaving time available until the voltage $V_1$ is reached is shorter.

Figure 5:
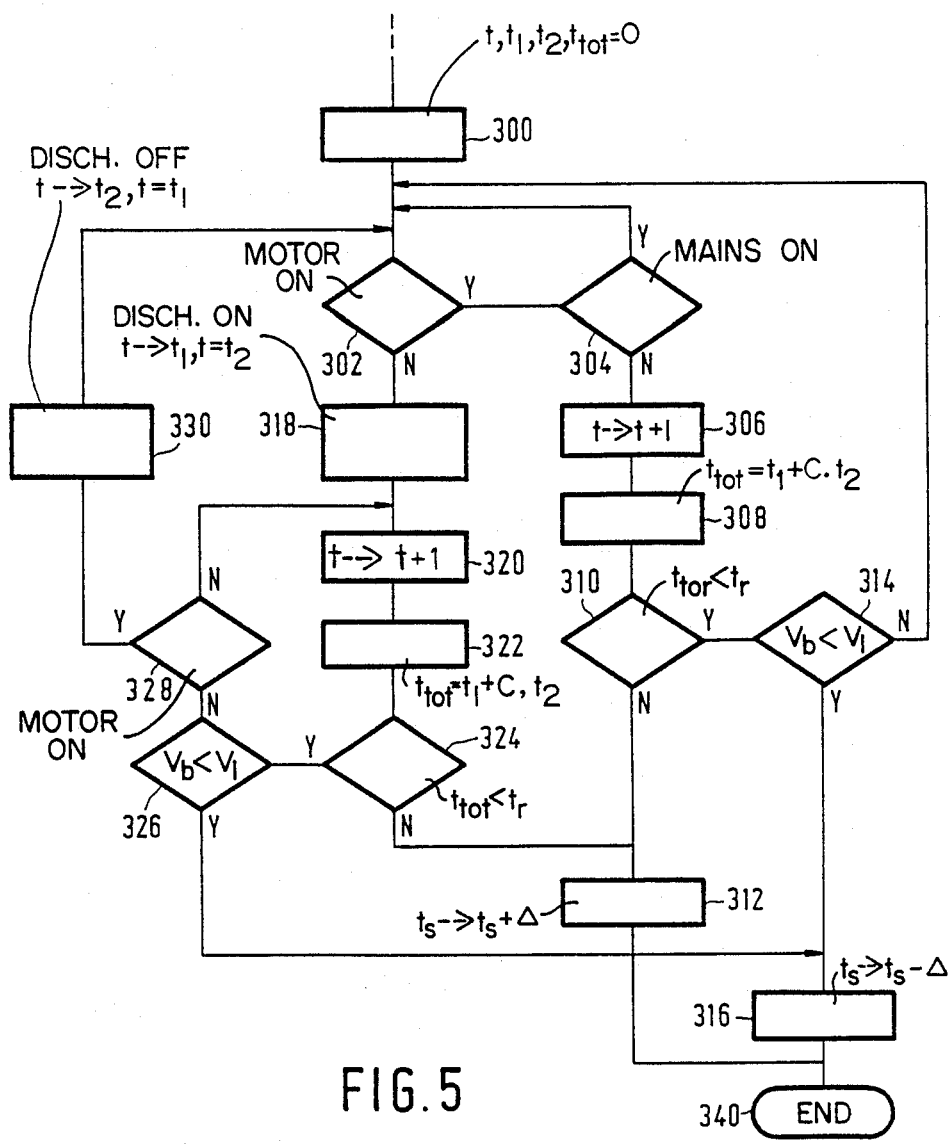
FIG. 5 is a flow chart of the program of the microprocessor shown in FIG. 3 in the case where the device of FIG. 3 operates in the same way as that of FIG. 2.

FIG. 5 is the flow chart of the program performed by the microprocessor in the case that the operation of the device corresponds to that shown in FIG. 2, the discharger circuit being switched on for a maximum time. The first part of the program up to block 222 is identical to that in FIG. 4. In this block it is again ascertained whether in the battery-shaving mode said discharge time $t_s$ has expired. If this is the case, the program is continued in block 300, designated "$t_1, t_1, t_2, t_{tot} = 0$", in which the time intervals measured are reset to zero. Subsequently, in block 302, designated "motor on", it is detected whether the motor is on and, if it is on, it is detected in block 304, designated "mains on" whether the mains-shaving mode or the battery shaving occurs. During mains-shaving the program each time jumps back from block 302. In the battery-shaving mode the time during which the motor is energized is measured. In block 306, designated "t→t+1" the count is each time incremented by one and subsequently, in block 308, designated "$t_{tot} = t_1 + c.t_2$", the weighted sum is determined of the time during which the motor has been energized and the time during which the discharger circuit has already been operative, the weighting factor again being equal to the ratio between the discharging current and the nominal shaving current. After this, in block 320, designated "$t_{tot} < t_r$", it is detected whether this time $t_{tot}$ is smaller than the reference value $t_r$, which indicates the desired residual shaving time available after detection of the expiration of the discharged time $t_s$. If $t_{tot} > t_r$, in block 312, designated "$t_s → t_s + \Delta$", the motor is switched off and the discharge time $t_s$ is increased so that, during the next discharge after detection of the time $t_s$, the available shaving time is shorter and in better agreement with the reference value $t_r$. In block 314, designated "$V_b < V_1$", if the time $t_{tot} < t_r$, it is subsequently detected whether the battery voltage $V_b$ has become smaller than the value $V_1$. If this is not the case, the program jumps back to block 302 and the loop is repeated to measure the time during which the motor is energized after detection of the time $t_s$ in the battery-shaving mode. If the battery voltage has become lower than the voltage $V_1$, in block 316, designated "$t_s → t_s - \Delta$", the motor is switched off and the time $t_s$ is reduced so that, during the next discharge after detection of this time $t_s$, a longer residual shaving time is available. If the motor is switched off in this battery-shaving mode, which is detected in block 302, then, in block 318, designated "discharge on, t→$t_1$, t=$t_2$", the time $t_1$ during which the motor has been energized is loaded into the memory and the time t is set to the value $t_2$ during which the discharger circuit has already been operative. Subsequently, in block 320, designated "t→t+1", the time is increased and in block 322, designated "$t_{tot} = t_1 + c.t_2$", the weighted sum of the time intervals $t_1$ and $t_2$ is determined, where c is the weighting factor which is equal to the ratio between the discharge current and the nominal shaving current. If, in block 324, designated "$t_{tot} < t_r$", it is detected that $t_{tot}$ is greater than the reference value $t_r$, the discharger circuit is switched off and the time $t_s$ is increased in block 312, designated "$t_s → t_s + \Delta$", so that during the next discharge after detection of this time $t_s$ a shorter residual shaving time is available, which is in better agreement with the desired value. If $t_{tot} < t_s$, it is detected in block 326, designated "$V_b < V_1$", whether the battery voltage has decreased below the value $V_1$. If this is the case the time $t_s$ is reduced in block 316, so that during the next discharge after expiration of this time a longer residual shaving time is available, which is in better agreement with the desired value. As long as battery voltage is higher than the voltage $V_1$ and the motor is not switched on again, the time during which the discharger circuit is operative is measured. If in block 330, designated "discharge off, t→$t_2$, t=$t_1$", the motor is switched on again, the discharger circuit is made inoperative, the power-supply circuit is enabled if necessary, the discharge time $t_2$ is loaded into the memory, and the time is set to the value $t_1$, after which the program is repeated starting at block 302.

The invention is not limited to the embodiments described herein. Within the scope of the invention many variants are conceivable to those skilled in the art. For example, the first and the second detection means, the first and the second time-measurement means, and the correction means can be constructed in other ways than shown. Further, the battery may be charged in other ways.

What is claimed is:

1. A device comprising:
   a rechargeable battery connectable to a load for energizing said load,
   a power-supply circuit for charging the battery and/or energizing the load,
   first detection means for detecting the expiration of a discharge time of the battery when the battery is connected to the load,
   a discharger for discharging the battery when the battery is disconnected from the load after detection of said expiration of said discharge time,
   second detection means for detecting a battery voltage substantially equal to a voltage threshold value,
   first time-measurement means for measuring a first time interval during which the battery is connected to the load after detection of said expiration of said discharge time and until detection of the voltage threshold value,
   second time-measurement means for measuring a second time interval during which the discharger is operative and the battery is disconnected from the load after detection of said expiration of said discharge time and until detection of the voltage threshold value, and
   correction means for correcting said discharge time depending on the weighted sum of said first time interval and said second time interval as measured by the first and the second time-measurement means and relative to a reference value.

2. A device as claimed in claim 1, further comprising:
   third detection means for detecting a weighted sum of the first and second time intervals measured by the first and second time-measurement means, which sum is substantially equal to the reference value, and for switching off the discharger or the load after detection of said sum.

3. A device as claimed in claim 2 further comprising means for switching off the power-supply circuit when the discharger circuit is operative.

4. A device as claimed in claim 2 wherein the discharger comprises a series arrangement of a resistor and a transistor switch, said series arrangement being connected in parallel with the load.

5. A device as claimed in claim 4 further comprising a light-emitting diode connected in series with the resistor.

6. A device as claimed in claim 1 further comprising means for switching off the power supply circuit when the discharger circuit is operative.

7. A device as claimed in claim 1 wherein the discharger comprises a series arrangement of a resistor and a transistor switch, said series arrangement being connected in parallel with the load.

8. A device as claimed in claim 1, further comprising:
   switching means for selectively connecting said battery to the load,
   the power supply circuit selectively coupling said battery to a source of AC mains voltage, and
   a control circuit responsive to first and second signals indicating whether or not the battery is connected to the load and whether or not the battery is coupled to the AC mains voltage via the power supply circuit, respectively, said control circuit being operative to determine whether the device is in a battery-shaving, a mains-shaving or a battery-charging mode and to produce output signals as a result of such determination to control operation of the discharger, the switching means and said first and second time-measurement means.

9. A device as claimed in claim 8, further comprising:
   a logic circuit controlled by signals from the control circuit, the first detection means and the second detection means thereby to supply a signal to control the discharger.

10. A device as claimed in claim 1, wherein said battery, said discharger and said second detection means are all connected in parallel to a pair of voltage supply lines, and further comprising
    switching means for connecting said load to said pair of voltage supply lines so that the load is in parallel with the battery, etc.

11. A dry-shaver comprising:
    a motor,
    means coupling said motor to a device, said device comprising:
    a rechargeable battery connectable to the motor for energizing said motor,
    a power-supply circuit for charging the battery and/or energizing the motor,
    first detection means for detecting the expiration of a discharge time of the battery when the battery is connected to the motor,
    a discharger for discharging the battery when the battery is disconnected from the motor after detection of said expiration of said discharge time,
    second detection means for detecting a battery voltage substantially equal to a voltage threshold value,
    first time-measurement means for measuring a first time interval during which the battery is connected to the motor after detection of said expiration of said discharge time and until detection of the voltage threshold value,
    second time-measurement means for measuring a second time interval during which the discharger is operative and the battery is disconnected from the motor after detection of said expiration of said discharge time and until detection of the voltage threshold value, and
    correction means for correcting said discharge time depending on the weighted sum of said first time interval and said second time interval as measured by the first and the second time-measurement means and relative to a reference value.

* * * * *